United States Patent
Yoshihara et al.

(10) Patent No.: US 10,686,423 B2
(45) Date of Patent: Jun. 16, 2020

(54) PHASE-SHIFTING CIRCUIT AND ANTENNA DEVICE

(71) Applicant: HITACHI METALS, LTD., Minato-ku, Tokyo (JP)

(72) Inventors: Satoshi Yoshihara, Utsunomiya (JP); Seiji Kado, Oyama (JP); Nobuaki Kitano, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 252 days.

(21) Appl. No.: 15/562,593

(22) PCT Filed: Mar. 30, 2015

(86) PCT No.: PCT/JP2015/059959
§ 371 (c)(1),
(2) Date: Sep. 28, 2017

(87) PCT Pub. No.: WO2016/157374
PCT Pub. Date: Oct. 6, 2016

(65) Prior Publication Data
US 2018/0115297 A1 Apr. 26, 2018

(51) Int. Cl.
*H03H 7/18* (2006.01)
*H01P 1/18* (2006.01)
(Continued)

(52) U.S. Cl.
CPC ............... *H03H 7/185* (2013.01); *H01P 1/18* (2013.01); *H01P 1/184* (2013.01); *H01Q 1/48* (2013.01);
(Continued)

(58) Field of Classification Search
CPC ............ H03H 7/185; H03H 7/38; H01Q 3/32; H01Q 1/48; H01Q 3/38; H01P 1/184; H01P 1/18
(Continued)

(56) References Cited

U.S. PATENT DOCUMENTS

2002/0093383 A1* 7/2002 Thompson ............ H03F 1/0288
330/295
2002/0135517 A1* 9/2002 Yu ........................ G01S 13/4436
342/427
(Continued)

FOREIGN PATENT DOCUMENTS

JP H11-205002 A 7/1999
JP 2002-280804 A 9/2002
(Continued)

OTHER PUBLICATIONS

International Search Report and Written Opinion, PCT/JP2015/059959, dated Oct. 12, 2017, 6 pages.

*Primary Examiner* — Bo Fan
(74) *Attorney, Agent, or Firm* — Foley & Lardner LLP

(57) ABSTRACT

A phase-shifting circuit 1 includes a signal conductor 2 that transmits signals, and a dielectric body 3 that is disposed to overlap the signal conductor 2, said phase-shifting circuit changing the phase of the signals by changing the area of an overlapping section 5 where the signal conductor 2 and the dielectric body 3 overlap each other. The phase-shifting circuit further includes a transformer unit 7 for matching impedance between the overlapping section 5 and non-overlapping section 6 where the signal conductor 2 and the dielectric body 3 do not overlap each other, said transformer unit being provided at end sections of the dielectric body 3, said end sections being on the input side and output side of the signals. The transformer unit 7 includes a high-impedance section 7a that is provided on the overlapping section 5 side, and a low-impedance section 7b, which is provided on the non-overlapping section 6 side of the high-impedance section 7a, and which has a lower characteristic impedance than the high-impedance section 7a.

7 Claims, 9 Drawing Sheets

(51) Int. Cl.
    *H01Q 3/32*      (2006.01)
    *H01Q 1/48*      (2006.01)
    *H01Q 3/38*      (2006.01)
    *H03H 7/38*      (2006.01)

(52) U.S. Cl.
    CPC ................. *H01Q 3/32* (2013.01); *H01Q 3/38* (2013.01); *H03H 7/38* (2013.01)

(58) Field of Classification Search
    USPC .......................... 342/371, 427; 333/161, 32
    See application file for complete search history.

(56)         References Cited

U.S. PATENT DOCUMENTS

| | | | | |
|---|---|---|---|---|
| 2010/0019858 | A1* | 1/2010 | McMorrow | H03F 1/56 |
| | | | | 333/32 |
| 2010/0264954 | A1* | 10/2010 | Drost | H01L 23/3171 |
| | | | | 326/30 |
| 2011/0285473 | A1* | 11/2011 | Hauer | H03H 7/185 |
| | | | | 333/33 |
| 2012/0105147 | A1* | 5/2012 | Harris | H03F 1/56 |
| | | | | 330/57 |
| 2013/0165058 | A1* | 6/2013 | Mostafa | H04B 1/0064 |
| | | | | 455/91 |
| 2014/0033264 | A1* | 1/2014 | Li | H04N 21/61 |
| | | | | 725/127 |
| 2014/0184455 | A1* | 7/2014 | Lea | H01Q 9/285 |
| | | | | 343/745 |
| 2014/0232484 | A1* | 8/2014 | Sakasai | H01P 1/184 |
| | | | | 333/161 |
| 2016/0359229 | A1* | 12/2016 | Koster | H01Q 3/36 |

FOREIGN PATENT DOCUMENTS

| | | |
|---|---|---|
| JP | 2008-2160269 A | 7/2008 |
| JP | 4745213 B2 | 8/2011 |
| JP | 2014-158188 A | 8/2014 |
| WO | WO-2011/145894 A1 | 11/2011 |

* cited by examiner

PHASE-SHIFTING CIRCUIT AND ANTENNA DEVICE

FIELD OF THE INVENTION

The present invention relates to a phase-shifting circuit and an antenna device.

BACKGROUND OF THE INVENTION

Patent Literature 1 discloses an example of conventional phase-shifting circuits.

The phase-shifting circuit described in the patent literature 1 is configured to comprise a plurality of intersections in which a signal conductor and dielectric bodies are overlapping along a longitudinal direction of the phase-shifting circuit, and an overlapping area of the signal conductor and the dielectric bodies in each intersection is changed by moving the dielectric bodies in the longitudinal direction of the phase-shifting circuit, thereby changing a phase of signal transmitting through the signal conductor.

PRIOR ART DOCUMENTS

Patent Literatures

Patent Literature 1: JP-A 2014-158188
Patent Literature 2: Japanese Patent No. 4745213

SUMMARY OF THE INVENTION

Problem to be Solved by the Invention

However, in the phase-shifting circuit described in the patent literature 1, there is a disadvantage in that a full length may become large since it is necessary to increase the number of intersections in order to increase a phase shifting amount.

In addition, in the phase-shifting circuit described in the patent literature 1, it is necessary to adjust a shape of the dielectric body, an interval between the intersections and the like so as to obtain excellent VSWR (Voltage Standing Wave Ratio) characteristic in a wide frequency band. In this case, there is a disadvantage in that linearity between a driving amount and the phase shifting amount may decrease depending on the shape of the dielectric body after the adjustment, and the control of movement of the dielectric body may become complicated.

Accordingly, it is an object of the present invention to provide a phase-shifting circuit and an antenna device which can increase the phase shifting amount while minimizing the size as well as which can achieve excellent VSWR characteristic in a wide frequency band.

Means for Solving the Problems

For solving the above problems, the present invention provides a phase-shifting circuit, comprising:

a signal conductor for transmitting a signal; and a dielectric body disposed to overlap with the signal conductor, to change a phase of the signal by changing an area of an overlapping section in which the signal conductor overlaps with the dielectric body by moving the dielectric body, the phase-shifting circuit further comprising:

a transformer unit provided on an input side end and an output side end for the signal of the dielectric body, for impedance matching between the overlapping section and a non-overlapping section, in which the signal conductor does not overlap with the dielectric body, the transformer unit comprising a high-impedance section provided on an overlapping section side and a low-impedance section provided on a non-overlapping section side, a characteristic impedance of the low-impedance section being lower than a characteristic impedance of the high-impedance section.

Also, for solving the above problem, the present invention provides an antenna device comprising the phase-shifting circuit.

Effect of the Invention

According to the present invention, it is possible to provide a phase-shifting circuit and an antenna device which can increase the phase shifting amount while minimizing the size as well as which can achieve excellent VSWR characteristic in a wide frequency band.

BRIEF DESCRIPTION OF DRAWINGS

FIGS. 1A and 1B are drawings showing a phase-shifting circuit in an embodiment of the present invention, in which FIG. 1A is a top view thereof in which one grounding conductor is omitted and FIG. 1B is a cross sectional view along A-A line of FIG. 1A;

FIGS. 8A to 8C are drawings showing a phase-shifting circuit in a variation of the present invention, in which FIG. 8A is a top view thereof in which one grounding conductor is omitted, FIG. 8B is a cross sectional view along B-B line of FIG. 8A, and FIG. 8C is a top view showing a multistage configuration of the phase-shifting circuit of FIG. 8A;

FIGS. 10A and 10B are drawings showing a phase-shifting circuit in a variation of the present invention, in which FIG. 10A is a top view thereof in which one grounding conductor is omitted and FIG. 10B is a cross sectional view along C-C line of FIG. 10A.

DETAILED DESCRIPTION OF THE EMBODIMENT

Embodiment

Next, an embodiment of the present invention will be described below in conjunction with appended drawings.

Figure 1A:
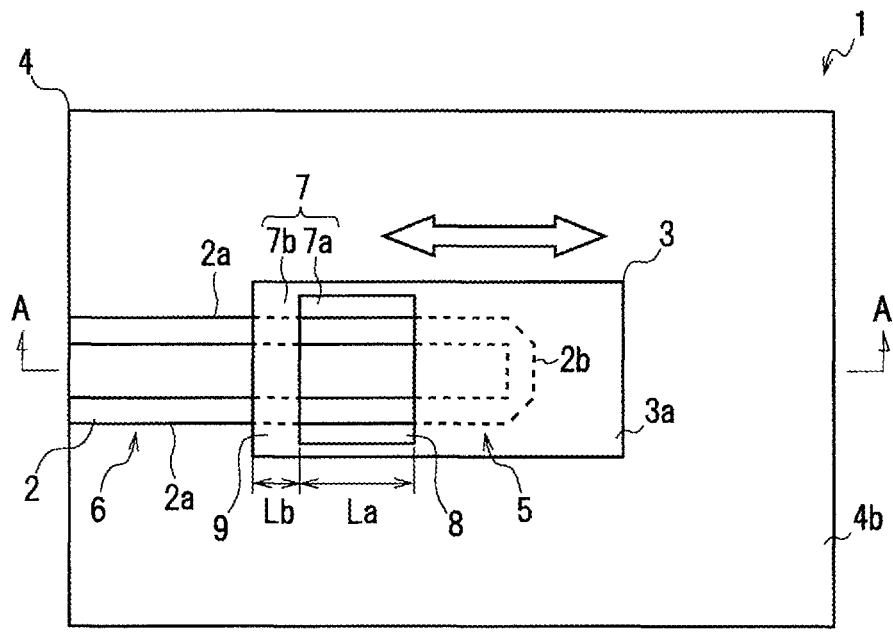
Figure 1B:
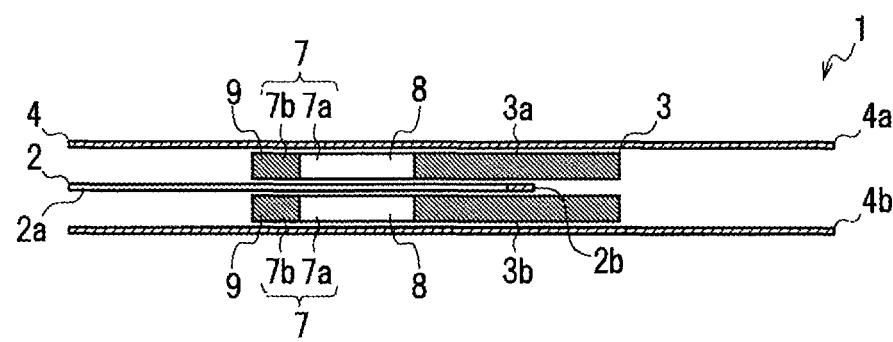

FIGS. 1A and 1B are drawings showing a phase-shifting circuit in an embodiment of the present invention, in which FIG. 1A is a top view thereof in which one grounding conductor is omitted and FIG. 1B is a cross sectional view along A-A line of FIG. 1A.

As shown in FIGS. 1A and 1B, a phase-shifting circuit 1 comprises a signal conductor 2 for transmitting signals, a dielectric body 3 which is disposed to overlap with the signal conductor 2, and a grounding conductor 4 which is disposed on the dielectric body 3 on an opposite side to the side of the signal conductor 2.

The signal conductor 2 comprises a plate-shape member comprising a good electrical conductor. In the present embodiment, the signal conductor 2 comprises two linear portions 2a disposed in parallel and a connection portion 2b to connect two ends (the ends positioned on a right side in FIGS. 1A and 1B) of the linear portions 2a, and is formed into a U-shaped portion which is rotated at an angle of 90 degrees in the counterclockwise direction in a top view. Joint portions connecting between the linear portions 2a and the connection portion 2b are chamfered.

Note that, in the present embodiment, although the plate-shape member comprising the good electrical conductor is used as the signal conductor 2, the present invention is not limited thereto. The signal conductor 2 may comprise a wiring pattern formed on both sides of a dielectric substrate comprising glass epoxy or the like. When a film-like material is used as the dielectric body, the signal conductor 2 may comprise a wiring pattern formed on one surface of the film-like substrate.

The grounding conductor 4 comprises a plate-shape member comprising a good electrical conductor. In the present embodiment, the phase-shifting circuit 4 has a triplate structure in which two grounding conductors 4 sandwich the signal conductor 2 from top and bottom. The grounding conductor 4 disposed above (the upper part of FIG. 1B) the signal conductor 2 is referred to as a first grounding conductor 4a and the grounding conductor 4 disposed below (the lower part of FIG. 1B) the signal conductor 2 is referred to as a second grounding conductor 4b. Note that, FIG. 1A shows a top view in which the first grounding conductor 4a is omitted.

The dielectric body 3 comprises a rectangular plate-shape member in a top view. Although the material of the dielectric body 3 is not limited, it is preferable to use a material having a dielectric constant as large as possible so as to increase the phase shifting amount.

In the present embodiment, the dielectric body 3 comprises a first dielectric body 3a and a second dielectric body 3b which sandwich the signal conductor 2 from top and bottom. The first dielectric body 3a is disposed between the signal conductor 2 and the first grounding conductor 4a, and the second dielectric body 3b is disposed between the signal conductor 2 and the second grounding conductor 4b. Both the dielectric bodies 3a, 3b are spaced from the signal conductor 2 and the grounding conductor 4 so as not to be affected by an electric field generated in the vicinity of the signal conductor 2 and the grounding conductor 4. That is, the first dielectric body 3a is spaced from the signal conductor 2 and the first grounding conductor 4a, and the second dielectric body 3b is spaced from the signal conductor 2 and the second grounding conductor 4b.

Both the dielectric bodies 3a, 3b are connected by a joint member (not shown). The dielectric bodies 3a, 3b are configured to be movable along a lateral direction in FIGS. 1A and 1B by a transfer mechanism (not shown) such as a DC motor.

Hereinafter, a portion in which the dielectric body 3 overlaps with the signal conductor 2 in the phase-shifting circuit 1 is referred to as an overlapping section 5, and a portion in which the signal conductor 2 and the dielectric body 3 do not overlap is referred to as a non-overlapping section 6. The non-overlapping section 6 is the part in which the signal conductor 2 and the grounding conductor 4 are facing to each other via an air layer.

The phase-shifting circuit 1 is configured such that the dielectric body 3 is moved by a moving means, thereby changing an area of the overlapping section 5 where the dielectric body 3 overlaps with the signal conductor 2 in order to change the phase of signal transmitting through the signal conductor 2. In the phase-shifting circuit 1, the phase of the signal is delayed in accordance with the increase in the area of the overlapping section 5 and the phase of the signal is advanced in accordance with the decrease in the area of the overlapping section 5. Thus, in the case of FIGS. 1A and 1B, the phase of the signal can be delayed with respect to the phase in a reference position by moving the dielectric body 3 from a certain reference position toward the left side in the drawings (toward base ends of the parallel portions 2a), and the phase of the signal can be advanced with respect to the phase in the reference position by moving the dielectric body 3 from the reference position toward the right side in the drawings (toward tip ends of the parallel portions 2a and the connection portion 2b). A moving range of the dielectric body 3 is preset. The phase-shifting circuit 1 is configured such that the phase of the signal is changed by changing the area of the overlapping section 5 by moving the dielectric body 3 within the moving range.

In addition, the phase-shifting circuit 1 in the present embodiment further comprises transformer units 7 for impedance matching between the overlapping section 5 and the non-overlapping section 6 on an input side end and an output side end for the signals of the dielectric body 3. Here, the input side end and the output side end for the signals of the dielectric body 3 are namely portions in the vicinity of a boundary between the overlapping section 5 and the non-overlapping section 6 in the dielectric body 3, in other words, edge portions of the dielectric body 3 in the vicinity of the extending portions (parallel portions 2a), from the overlapping section 5 toward the non-overlapping section 6, of the signal conductor 2 on the input side and the output side of the signals. Note that, in the present embodiment, although the transformer unit 7 is formed by processing a part of the dielectric body 3, the transformer unit 7 is treated as a separate (independent) member from the dielectric body 3, not as a part of the dielectric body 3. That is, the overlapping section 5 does not include the part where the transformer unit 7 overlaps with the signal conductor 2.

In the present embodiment, because the portions of the signal conductor 2 (the parallel portions 2a) on the input side and the output side are extended toward the same orientation (the left direction in the drawings), a transformer unit 7 which is common to the input side and the output side at the end of an extending side (the left side in the drawings) of the signal conductor 2 in the dielectric body 3. Note that the transformer units 7 may be provided respectively on the input side and the output side of the signal. The transformer units 7 are provided at both the first dielectric body 3a and the second dielectric body 3b, respectively.

Also, the transformer unit 7 is configured to be always located on the input side end and the output side end of the signal of the dielectric body 3 whenever the dielectric body 3 is moved in a preset moving range. Herein, the transformer unit 7 will be located on the input side end and the output side end of the signal of the dielectric body 3 by all means even if the dielectric body 3 is moved along the lateral direction of the drawings, because the phase-shifting circuit 1 is configured such that the transformer unit 7 is formed at the end of the dielectric body 3 on the extending side of the signal conductor 2 and the dielectric body 3 moves along the extending direction of the signal conductor 2.

In the phase-shifting circuit 1, the transformer unit 7 comprises a high-impedance section 7a provided on the overlapping section 5 side, and a low-impedance section 7b provided on the non-overlapping section 6 side, the low-impedance section 7b having a lower characteristic impedance than that of the high-impedance section 7a. The effective dielectric constant between the signal conductor 2 and the grounding conductor 4 at the high-impedance section 7a is lower than the effective dielectric constant between the signal conductor 2 and the grounding conductor 4 at the low-impedance section 7b.

In the present embodiment, the high-impedance section 7a comprises an air layer, and the low-impedance section 7b comprises a dielectric layer having the same thickness as a thickness of the dielectric body 3 and comprising the same material as a material of the dielectric body 3. Herein, a through-hole 8 is formed at a position spaced from the input side end and the output side end of the signal of the dielectric body 3, and the transformer unit 7 is configured such that the through-hole 8 is provided as the high-impedance section 7a and a dielectric layer 9 is provided as the low-impedance section 7b, which comprises a part of the dielectric body 3 which remains between the through-hole 8 and the input side end and the output side end of the signal. Note that the through-hole 8 is formed into a rectangular shape, but the shape of the through-hole 8 is not limited thereto. Also, the through-hole 8 may be a notch which is opened laterally in the dielectric body 3.

A length La of the high-impedance section 7a along the signal conductor 2 and a length Lb of the low-impedance section 7b along the signal conductor 2 are adjusted to be a length that can match the impedance between the overlapping section 5 and the non-overlapping section 6.

Next, a principle of the operation of the phase-shifting circuit 1 is described below. In the following description, it is assumed that the characteristic impedance of the overlapping section 5 is 21Ω, the characteristic impedance of the non-overlapping section 6 is 50Ω, the characteristic impedance of the high-impedance section 7a of the transformer unit 7 is 50Ω, and the characteristic impedance of the low-impedance section 7b of the transformer unit 7 is 21Ω.

Figure 2A:
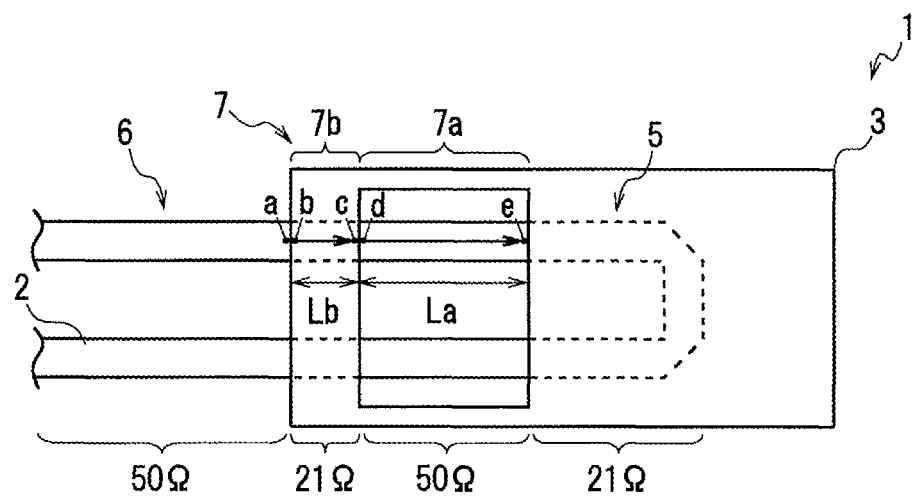
FIG. 2 is an explanatory diagram showing a principle of a transformer unit of the phase-shifting circuit in FIGS. 1A and 1B.
Figure 2B:
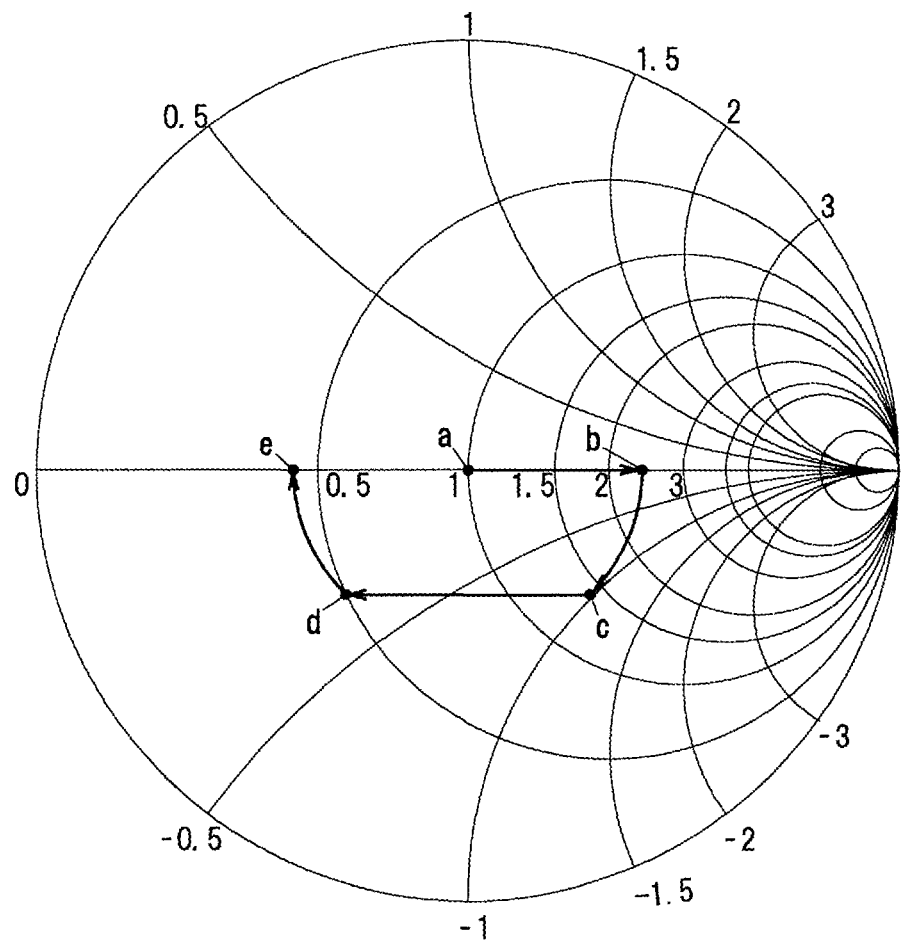

As shown in FIGS. 2A and 2B, since the characteristic impedance of the non-overlapping section 6 is 50Ω, an observation point of the non-overlapping section 6 in FIG. 2A is represented as coordinates (1, 0) in real axis on the Smith chart (impedance chart) of FIG. 2B in which the reference impedance is 50Ω.

Here, when the observation point is moved from the point a to the point b, i.e. from the non-overlapping section 6 to the low-impedance section 7b in FIG. 2A, the observation point is moved from the point a to the point b in the real axis on the Smith chart in FIG. 2B. Assuming that the coordinates in the real axis of the point b as (x, 0), the value of x is the value obtained by normalizing the characteristic impedance of the non-overlapping section 6 with the characteristic impedance of the low-impedance section 7b, namely, x=50/21=approximately 2.38.

Furthermore, when the observation point is moved from the point b to the point c, i.e. the low-impedance section 7b is moved from the non-overlapping section 6 side to the high-impedance section 7a side in FIG. 2A, the observation point is moved from the point b to the point c along an arc around the point a on the Smith chart of FIG. 2B. A moving length from the point b to the point c, i.e., the rotation angle from the point b to the point c, is determined by a wavelength λg (effective wavelength in the non-overlapping section 6) corresponding to a center frequency of the signal transmitting through the signal conductor 2 and the length Lb of the low-impedance section 7b. In the present embodiment, the coordinates of the point c is approximately (1.2, −0.95).

When the observation point is moved from the point c to the point d, i.e. from the low-impedance section 7b to the high-impedance section 7a in FIG. 2A, the normalized impedance moves from 21Ω to 50Ω so that the observation point moves from the point c to the point d in parallel to the real axis on the Smith chart of FIG. 2B. In the present embodiment, the coordinates of the point d is approximately (0.5, −0.4).

Furthermore, when the observation point is moved from the point d to the point e, i.e. the high-impedance section 7a is moved from the low-impedance section 7b side to the overlapping section 5 side in FIG. 2A, the observation point is moved from the point d to the point e along an arc around the point a on the Smith chart of FIG. 2B. A moving length from the point d to the point e, i.e., the rotation angle from the point d to the point e, is determined by a wavelength λg (effective wavelength in the non-overlapping section 6) corresponding to a center frequency of the signal transmitting through the signal conductor 2 and the length La of the high-impedance section 7b.

Assuming that the point e is located on the real axis and the coordinates thereof is (y, 0), the impedance matching between the overlapping section 5 and the non-overlapping section 6 can be conducted by adjusting the lengths La, Lb of the both impedance sections 7a, 7b such that the value of y becomes the characteristic impedance of the high-impedance section 7a normalized by the characteristic impedance of the overlapping section 5, namely, y=21/50=approximately 0.42.

In the phase-shifting circuit 1, the rotation angle 2θ in both the impedance sections 7a, 7b on the Smith chart is less than 180 degrees (θ is less than 90 degrees). Therefore, in comparison with a case of using a λ/4 transformer for conducting the impedance matching based on the rotation angle 2θ being 180 degrees (θ is 90 degrees), it is possible to shorten the length of the transformer unit 7 along the signal conductor 2, thereby downsize the whole phase-shifting circuit 1.

Figure 3:
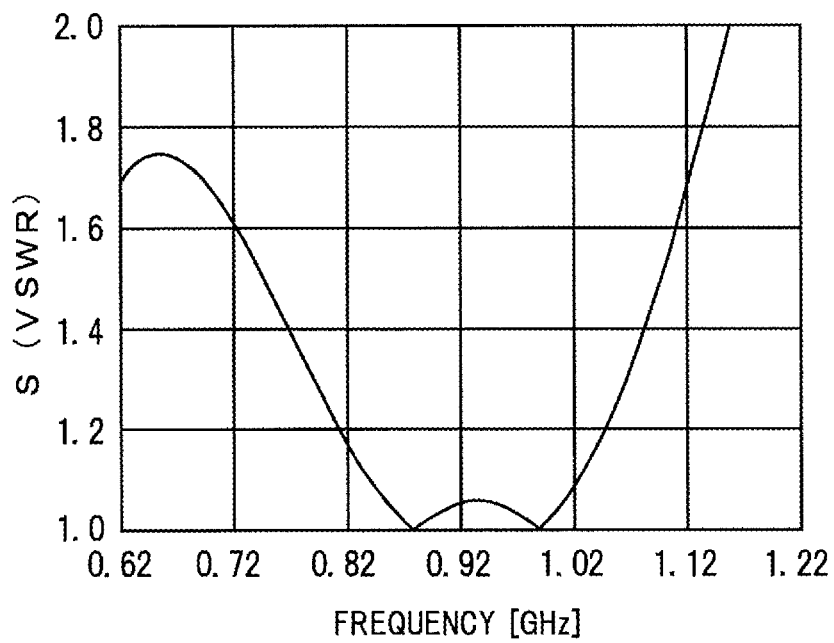
FIG. 3 is a graph showing a simulation result of VSWR (Voltage Standing Wave Ratio) characteristic of the phase-shifting circuit in FIGS. 1A and 1B.

FIG. 3 shows a simulation result of VSWR (Voltage Standing Wave Ratio) characteristic of the phase-shifting circuit in FIGS. 1A and 1B.

As shown in FIG. 3, in the phase-shifting circuit 1, the VSWR is 1.2 within the frequency range of approximately 0.8 GHz to 1.07 GHz, and the impedance matching is good. It is confirmed that good VSWR characteristic can be achieved in a wide frequency band.

Figure 4:
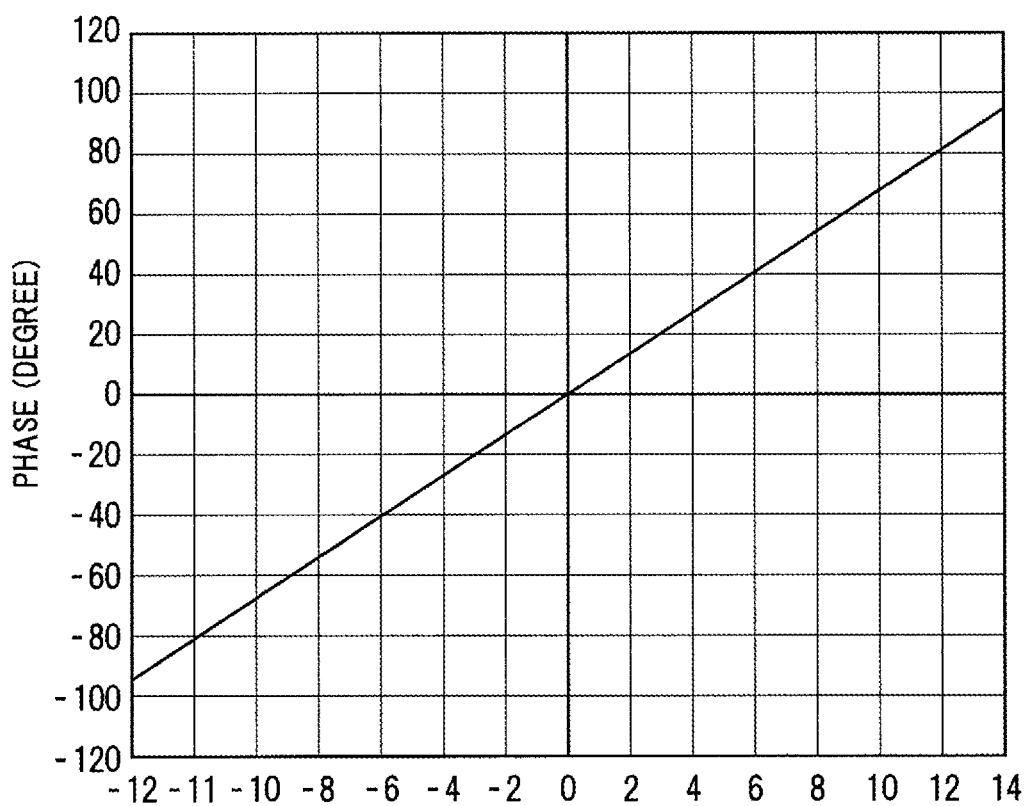
FIG. 4 is a graph showing a simulation result of a relationship between a driving amount and phase shifting of the phase-shifting circuit in FIGS. 1A and 1B.

Also, FIG. 4 shows a graph showing a simulation result of a relationship between a driving amount and phase shifting of the phase-shifting circuit in FIGS. 1A and 1B. Note that driving amount is a moving amount of the dielectric body 3 in the lateral direction of FIG. 1.

As shown in FIG. 4, it is confirmed that the relationship between the driving amount and the phase is approximately linear in the phase-shifting circuit 1 at least within a phase shifting amount range between 90 degrees to −90 degrees, and that the high linearity is achieved.

Then, an antenna device using the phase-shifting circuit 1 will be described below.

Figure 5:
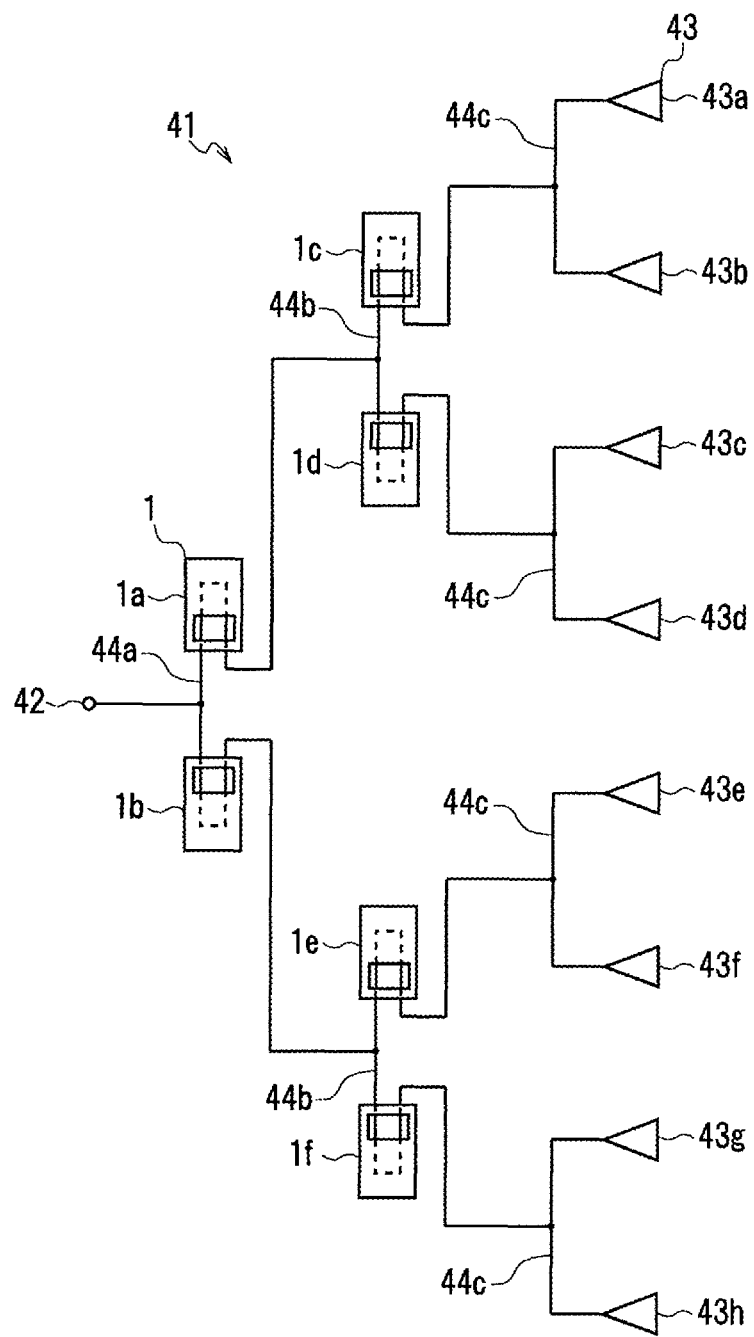
FIG. 5 is a schematic diagram of an antenna device using the phase-shifting circuit of FIGS. 1A and 1B.

As shown in FIG. 5, an antenna device 41 comprises an input terminal 42 to which high frequency signal is input, a first distribution line 44a for distributing the signal input to the input terminal 42, second distribution lines 44b each of which further distributes the signal distributed by the first distribution line 44a, third distribution lines 44c each of which further distributes the signal distributed by the second distribution line 44b, antenna elements 43 connected to terminal portions of the third distribution line 44c. Each of distribution lines 44a to 44c has a line configuration of "1 Input 2 Output", and eight antenna elements 43a to 43h in total are connected to terminal portions of the third distribution lines 44c, respectively.

Each phase-shifting circuit 1 is provided between the first distribution line 44a and the second distribution lines 44b and between the second distribution line 44b and the third distribution lines 44c, respectively. Herein, six phase-shifting circuits 1a to 1f in total are provided at two locations between the first distribution lines 44a and the second distribution lines 44b and at four locations between the second distribution lines 44b and the third distribution lines 44c.

The phase-shifting circuits 1a, 1b provided between the first distribution line 44a and the second distribution lines 44b, the phase-shifting circuits 1c, 1d and the phase-shifting circuits 1e, 1f provided between the second distribution lines 44b and the third distribution lines 44c are used as pairs. When one of the pairs, i.e. the phase-shifting circuits 1a, 1c, 1e are advanced in phase with a predetermined phase shifting amount, the other of the pairs, i.e. the phase-shifting circuits 1b, 1d, 1f are delayed in phase with the same phase shifting amount. Herein, in each pair of the phase-shifting circuits 1a, 1b, the phase-shifting circuits 1c, 1d, and the phase-shifting circuits 1e, 1f, the phase-shifting circuits 1 constituting one pair are disposed to be turned over each other along the moving direction of the dielectric body 3, and the dielectric bodies 3 of both the phase-shifting circuits 1 are coupled with each other to be moved together. According to this configuration, a differential phase circuit, in which one of the phase-shifting circuits 1 constituting a pair is advanced in phase and the other of the phase-shifting circuits 1 constituting the pair is delayed in phase, is provided.

The directivity (electric tilt angle) of an electric wave emitted from the antenna elements 43a to 43h can be adjusted by changing the phase of the signals by the phase-shifting circuits 1a to 1f in the antenna device 41. Note that, a case using eight antenna elements 43 (43a to 43h) and six phase-shifting circuits 1 (1a to 1f) is described here, but the number of the antenna elements 43 and the number of the phase-shifting circuits 1 are merely one example and are not limited to the example shown in the drawings.

(Function and Effect of the Embodiment)

As discussed above, the phase-shifting circuit 1 in the present embodiment further comprises transformer units 7 for impedance matching between the overlapping section 5 and the non-overlapping section 6 on the input side end and the output side end for the signals of the dielectric body 3, and the transformer unit 7 comprises the high-impedance section 7a provided on the overlapping section 5 side, and the low-impedance section 7b provided on the non-overlapping section 6 side, and the low-impedance section 7b has a lower characteristic impedance than a characteristic impedance of the high-impedance section 7a.

According to the transformer unit 7, it is possible to achieve the impedance matching between the overlapping section 5 and the non-overlapping section 6 having different characteristic impedances and to provide excellent VSWR characteristic in a wide frequency band. Also, according to the phase-shifting circuit 1, the linearity between the driving amount and the phase shifting amount is high, and the movement control of the dielectric body 3 is easy.

Furthermore, according to the phase-shifting circuit 1, it is possible to increase the area of the overlapping section 5, namely, the phase shifting amount easily by adjusting the length along the moving direction of the dielectric body 3. Further, in comparison with the conventional art of providing a plurality of intersections along the moving direction of the dielectric body 3, it is possible to reduce the moving length of the dielectric body 3 required for obtaining the same area of the overlapping section 5, thereby minimize the size in the moving direction of the dielectric body 3.

Furthermore, in the phase-shifting circuit 1, the transformer unit 7 is configured to comprise the high-impedance section 7a and the low-impedance section 7b, and to conduct the impedance matching between the overlapping section 5 and the non-overlapping section 6 by adjusting the lengths La, Lb of the both impedance sections 7a, 7b along the signal conductor 2. Therefore, in comparison with e.g. the case of using the λ/4 transformer, it is possible to shorten the length of the transformer unit 7 along the signal conductor 2, thereby downsize the whole phase-shifting circuit 1.

That is, according to the present embodiment, it is possible to provide a phase-shifting circuit 1 which can increase the phase shifting amount while minimizing the size as well as which can achieve excellent VSWR characteristic in a wide frequency band.

Also, the phase-shifting circuit 1 is configured such that the transformer unit 7 is always located on the input side end and the output side end of the signal of the dielectric body 3 when the dielectric body 3 is moved within the moving range. Therefore, regardless of the position of the dielectric body 3, it is possible to match the impedance between the overlapping section 5 and the non-overlapping section 6, thereby achieve excellent VSWR characteristic.

Next, variations of the present invention will be described.

Figure 6A:
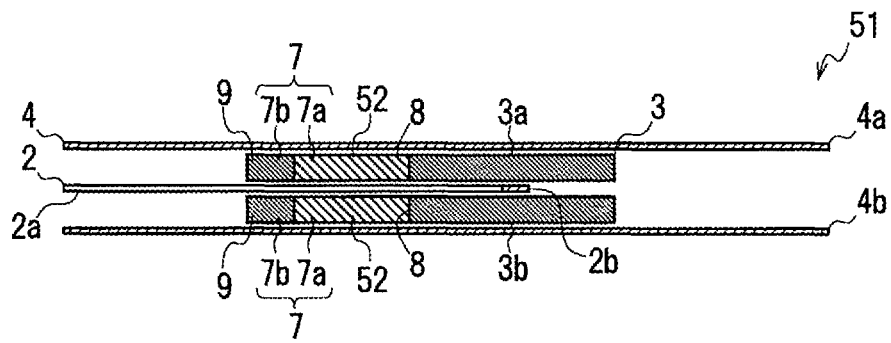
FIGS. 6A and 6B are cross-sectional views of the phase-shifting circuit in a variation of the present invention.

A phase-shifting circuit 51 shown in FIG. 6A is similar to the phase-shifting circuit 1 of FIGS. 1A and 1B except the high-impedance section 7a comprises a low dielectric constant dielectric layer 52 which is formed by filing the through-hole 8 with a dielectric body having a lower dielectric constant than the dielectric body 3. Even in the case such as the phase-shifting circuit 51 comprising the high-impedance section 7a comprising the low dielectric constant layer 52, the function and effect similar to those of the phase-shifting circuit 1 of FIGS. 1A and 1B can be obtained by adjusting the lengths La, Lb of the both impedance sections 7a, 7b to satisfy the condition for matching the impedance between the overlapping section 5 and the non-overlapping section 6 (i.e., to achieve approximately the same track on the Smith chart implement as the track in FIG. 2B).

Figure 6B:
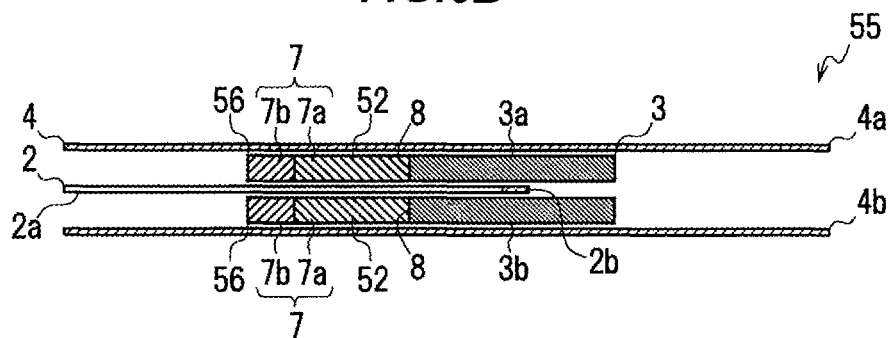

A phase-shifting circuit 55 shown in FIG. 6B is similar to the phase-shifting circuit 51 of FIG. 6A except the low-impedance section 7b comprises a high dielectric constant dielectric layer 56 which is different from the dielectric body 3 and the low dielectric constant dielectric layer 52. The high dielectric constant dielectric layer 56 comprises a material having a higher dielectric constant than the dielectric constant of the low dielectric constant dielectric layer 52. Even in this case, the function and effect similar to those of the phase-shifting circuit 1 of FIGS. 1A and 1B can be obtained by adjusting the lengths La, Lb of the both impedance sections 7a, 7b to satisfy the condition for matching the impedance between the overlapping section 5 and the non-overlapping section 6 (i.e., to achieve approximately the same orbit on the Smith chart implement as he orbit in FIG. 2 B).

Thus, the high-impedance section 7a is not limited to the air layer, and the low-impedance section 7b is not necessarily a part of the dielectric body 3. Also, the low-impedance section 7b and the dielectric body 3 are not necessarily formed integrally (as one piece). For example, the low-impedance section 7b and the dielectric body 3 may be formed as separate members and coupled by a joint member.

Figure 7:
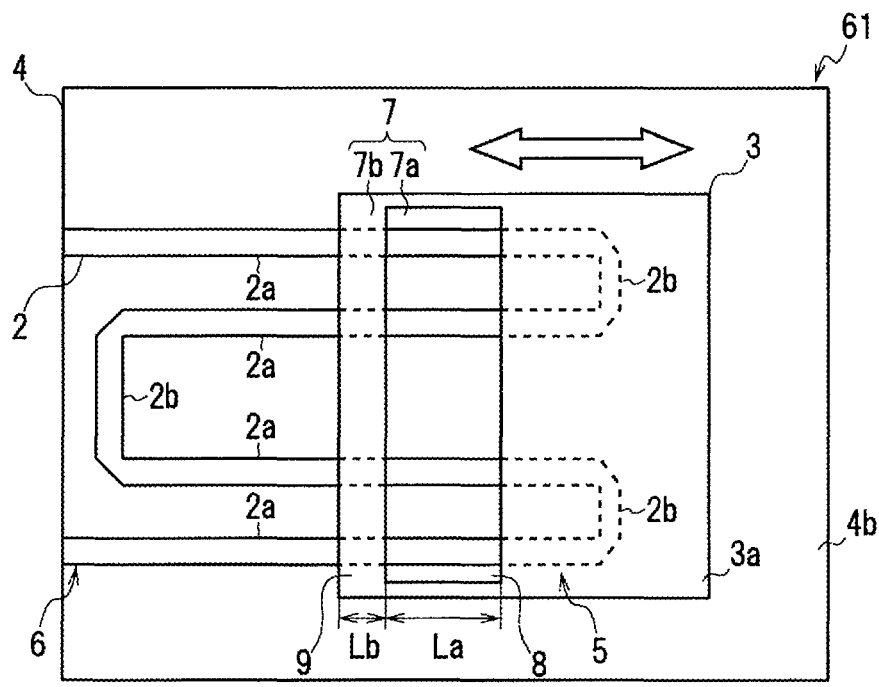
FIG. 7 is a top view of a phase-shifting circuit in a variation of the present invention in which one grounding conductor is omitted.

A phase-shifting circuit 61 shown in FIG. 7 is similar to the phase-shifting circuit 1 of FIGS. 1A and 1B except the signal conductor 2 is formed into a meander shape so as to increase the maximum area of the overlapping section 5 where the signal conductor 2 overlaps with the dielectric body 3. That is, according to the phase-shifting circuit 61, the phase shifting amount can be further increased. Also, according to the phase-shifting circuit 61, the size of the dielectric body 3 in the moving direction can be further reduced, since it is possible to achieve a large phase shifting amount even if the moving length of the dielectric body 3 is reduced. Note that the signal conductor 2 is replicated with three turns here to have an M-shaped form that is turned by 90 degrees in the clockwise direction in total, but the number of times of replicating the signal conductor 2 is not particularly limited.

Figure 8A:
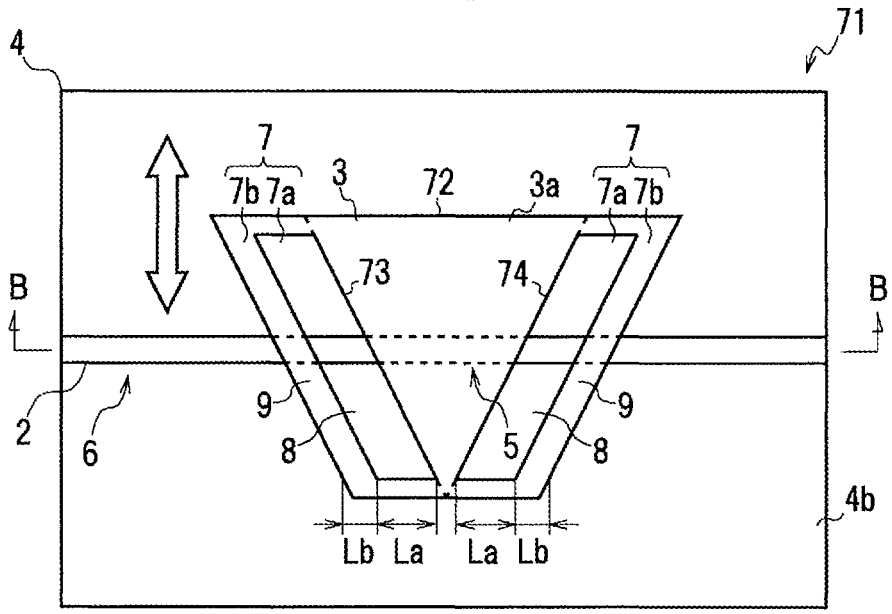
Figure 8B:
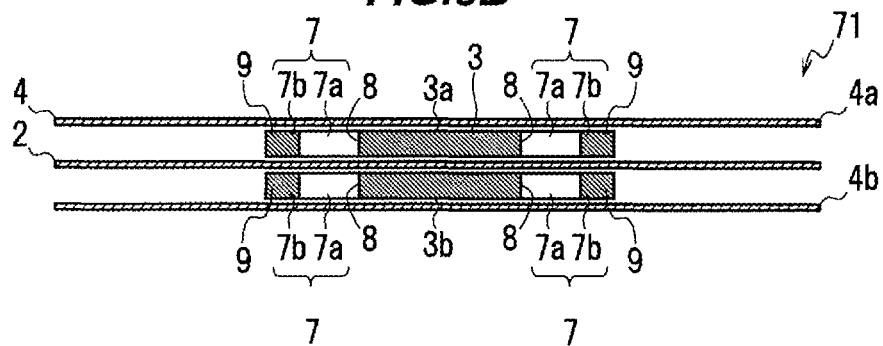

A phase-shifting circuit 71 shown in FIGS. 8A and 8B is configured such that the dielectric body 3 is moved along a direction orthogonal to the longitudinal direction of the signal conductor 2 formed into a linear shape. In the phase-shifting circuit 71, the dielectric body 3 is formed into a triangular shape (isosceles triangle shape) having a side 72 parallel to the signal conductor 2 and two sides 73, 74 intersecting diagonally the signal conductor 2. The transformer unit 7 is formed along the two sides 73, 74 intersecting diagonally the signal conductor 2. It is necessary to form the transformer unit 7 at least a part along the two sides 73, 74 intersecting the signal conductor 2 within the moving range of the dielectric body 3, since the position of the transformer unit 7 overlapping with the signal conductor 2 changes in accordance with the movement of the dielectric body 3 in the phase-shifting circuit 71. Herein, the case of forming the transformer unit 7 to be located along the sides 73, 74 is described. The transformer unit 7 is formed such that lengths La, Lb of both the impedance sections 7a, 7b along the signal conductor 2 become constant. In this case, the through-hole 8 having a parallelogram shape would be formed.

Figure 8C:
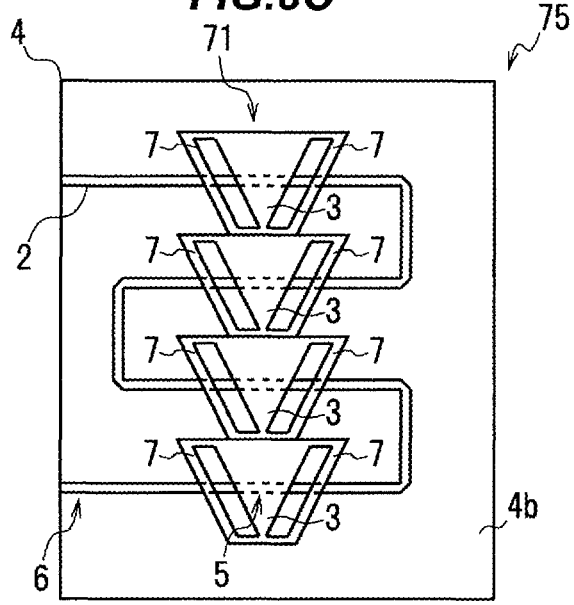

As shown in FIG. 8C, it is possible to provide a multistage phase-shifting circuit 75a in which the signal conductor 2 is formed into a meander shape, and a plurality of dielectric bodies 3 are coupled with each other along the moving direction, namely, a plurality of phase-shifting circuits 71 are coupled with each other, thereby increase the phase shifting amount.

Figure 9:
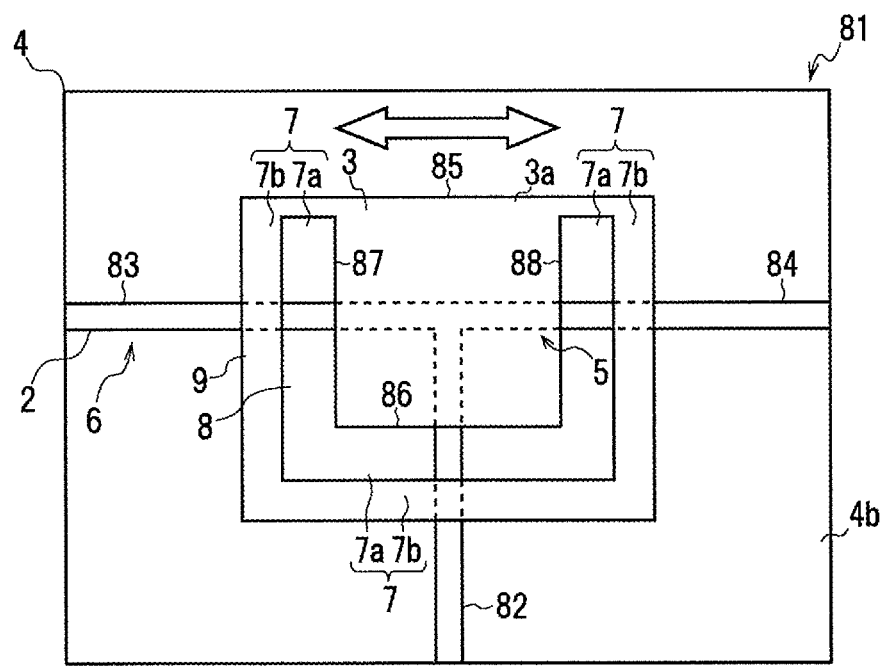
FIG. 9 is a top view of a phase-shifting circuit in a variation of the present invention in which one grounding conductor is omitted.

The phase-shifting circuit 81 shown in FIG. 9 integrates 1 Input 2 Output distribution lines and the differential phase-shifting circuit. The phase-shifting circuit 81 comprises one input signal conductor 82, two output signal conductors 83, 84 and a dielectric body 3 disposed to overlap with the signal conductors 82, 83, 84. The two output signal conductors 83, 84 are formed as one piece into a linear shape, and the input signal conductor 82 is connected to the output signal conductors 83, 84 in a direction orthogonal to the longitudinal direction of the output signal conductors 83, 84.

In the phase-shifting circuit 81, the dielectric body 3 is formed into a rectangular shape having two sides 85, 86 along the longitudinal direction of the output signal conductors 83, 84 and two sides 87, 88 that are intersecting at right angles with the two sides 85, 86. In the phase-shifting circuit 81, the dielectric body 3 is moved along the longitudinal direction of the output signal conductors 83, 84.

In the phase-shifting circuit 81, the transformer unit 7 is formed along the side 86 of the dielectric body 3 intersecting the input signal conductor 82 and the sides 87, 88 of the dielectric body 3 intersecting the output signal conductors 83, 84. It is necessary to form the transformer unit 7 at least along the side 86 intersecting the input signal conductor 82 within the moving range of the dielectric body 3, since the position of the transformer unit 7 overlapping with the input signal conductor 82 changes in accordance with the movement of the dielectric body 3 in the phase-shifting circuit 81. Herein, the case of forming a reverse TI-shaped through-hole 8 along the sides 86, 87, 88 is described, but the shape of the through-hole 8 is not particularly limited. A plurality of through-holes 8 may be provided to correspond to the sides 86, 87, 88.

In the phase-shifting circuit 81, when the dielectric body 3 is moved toward the left side in the drawing (the output signal conductor 83 side), the phase of the signal output from the signal conductor 83 is delayed and the phase of the signal output from the signal conductor 84 is advanced. Also, when the dielectric body 3 is moved toward the right side in the drawing (the signal conductor 84 side), the phase of the signal output from the signal conductor 83 is advanced and the phase of the signal output from the signal conductor 84 is delayed. Thus, the phase-shifting circuit 81 serves as a differential phase-shifting circuit.

Figure 10A:
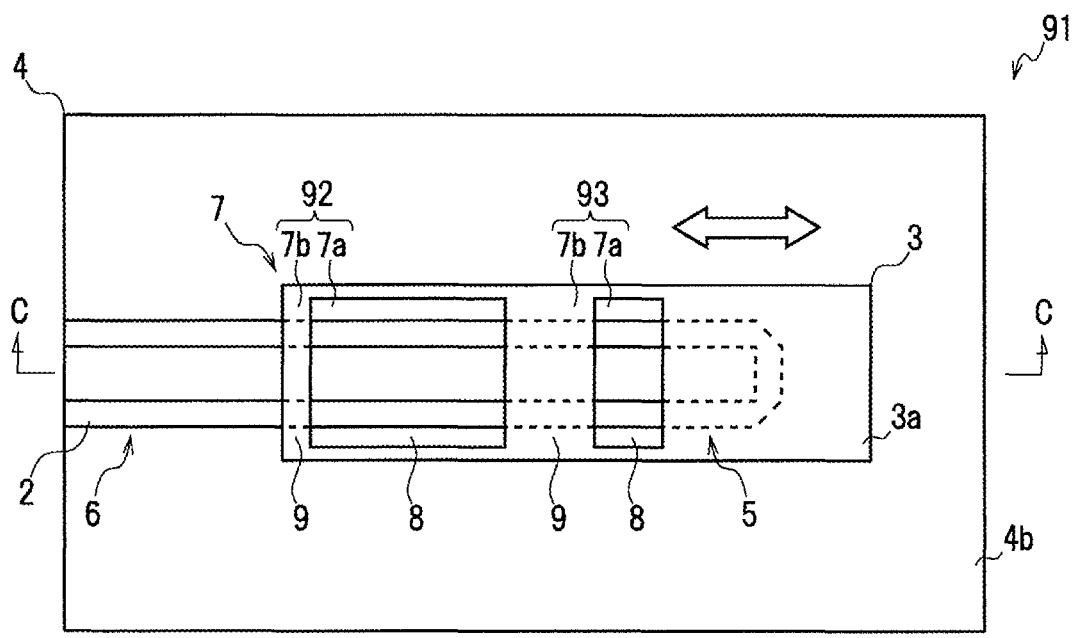
Figure 10B:
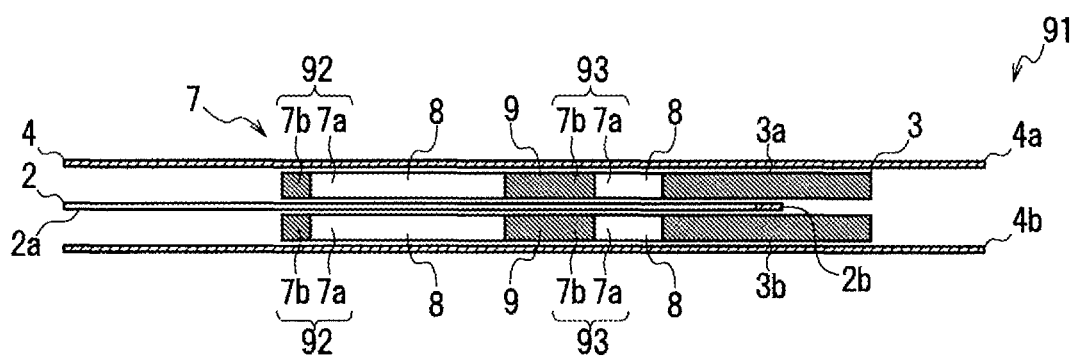

A phase-shifting circuit 91 shown in FIGS. 10A and 10B is configured to comprise a transformer unit 7 having a two-stage configuration. The transformer unit 7 formed on the input side and the output side of the signal is referred to as a first transformer unit 92, and the transformer unit 7 formed on the dielectric body 3 side is referred to as a second transformer unit 93.

In the phase-shifting circuit 91, the first transformer unit 92 is configured to conduct the impedance matching between the characteristic impedance of the non-overlapping section 6 and an intermediate characteristic impedance between the overlapping section 5 and the non-overlapping section 6 (it is simply referred to as "intermediate characteristic impedance") by adjusting the lengths La, Lb of both the impedance sections 7a, 7b. The second transformer unit 93 is configured to conduct the impedance matching between the intermediate characteristic impedance and the characteristic impedance of the overlapping section 5 by adjusting the lengths La, Lb of both the impedance sections 7a, 7b. That is, in the phase-shifting circuit 91, the transformer unit 7 is configured to conduct the impedance matching between the overlapping section 5 and the non-overlapping section 6 at two stages.

Figure 11:
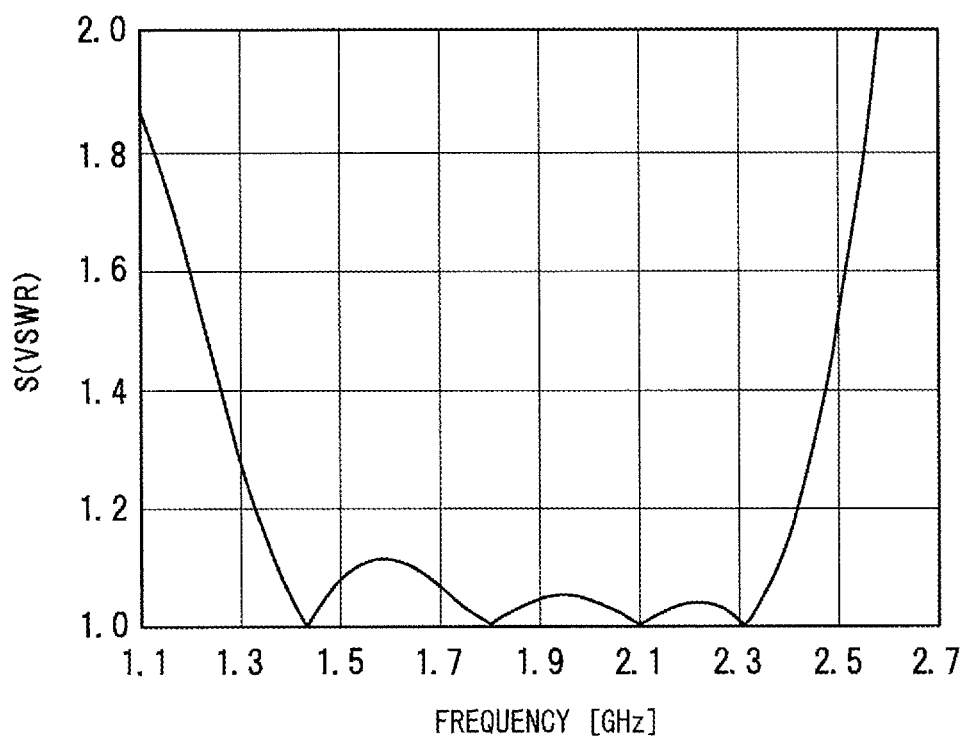
FIG. 11 a graph showing a simulation result of VSWR (Voltage Standing Wave Ratio) characteristic of the phase-shifting circuit in FIGS. 10A and 10B.

FIG. 11 shows a simulation result of VSWR (Voltage Standing Wave Ratio) characteristic of the phase-shifting circuit 91 in FIGS. 10A and 10B. As shown in FIG. 11, in the phase-shifting circuit 91, the VSWR is 1.2 within the frequency range of approximately 1.35 GHz to 2.4 GHz, and the impedance matching is good. It is confirmed that good VSWR characteristic can be achieved in a wider frequency band.

Herein, although the case of providing the transformer unit 7 having two-stage configuration is discussed, the number of stages may be three or more. The excellent VSWR characteristic can be achieved in a wider frequency band by increasing the number of the stages of the transformer unit 7.

Summary of the Embodiment

Next, the technical concept that is ascertained from the embodiments described above will be described with the aid of the reference characters and the like in the embodiment. It should be noted, however, that each of the reference characters in the following description should not be construed as limiting the constituent elements in the claims to the members and the like specifically shown in the embodiments.

[1] A phase-shifting circuit (1) comprising:
a signal conductor (2) for transmitting a signal; and
a dielectric body (3) disposed to overlap with the signal conductor (2), to change a phase of the signal by changing an area of an overlapping section (5) in which the signal conductor (2) overlaps with the dielectric body (3) by moving the dielectric body (3),
the phase-shifting circuit (1) further comprising:
a transformer unit (7) provided on an input side end and an output side end for the signal of the dielectric body (3), for impedance matching between the overlapping section (5) and a non-overlapping section (6), in which the signal conductor (2) does not overlap with the dielectric body (3), the transformer unit (7) comprising a high-impedance section (7a) provided on an overlapping section (5) side and a low-impedance section (7b) provided on a non-overlapping section (6) side, a characteristic impedance of the low-impedance section (7b) being lower than a characteristic impedance of the high-impedance section (7a).

[2] The phase-shifting circuit (1) according to [1], wherein the high-impedance section (7a) comprises an air layer and the low-impedance section (7b) comprises a dielectric layer having a same thickness as a thickness of the dielectric body (3) and comprising a same material as a material of the dielectric body (3).

[3] The phase-shifting circuit (1) according to [2], wherein the transformer unit (7) comprises a through-hole (8) formed at a position spaced from an input side end and an output side end of the signal of the dielectric body (3), and the transformer unit (7) is configured such that the through-hole (8) is provided as the high-impedance section (7a) and the dielectric body (3) between the through-hole (8) and the input side end and the output side end of the signal as the low-impedance section (7b).

[4] The phase-shifting circuit (1) according to any one of [1] to [3], wherein a phase of the signal is changed by changing an area of the overlapping section (5) by moving the dielectric body (3) within a moving range which is preset, and the transformer unit (7) is always located on the input side end and the output side end of the signal of the dielectric body (3) when the dielectric body (3) is moved within the moving range.

[5] The phase-shifting circuit (1) according to any one of [1] to [4], wherein the transformer unit (7) comprises a multistage configuration.

[6] The phase-shifting circuit (1) according to any one of [1] to [5], further comprising:
a grounding conductor (4) disposed on the dielectric body (3) on an opposite side to a side of the signal conductor (2),
wherein an effective dielectric constant between the signal conductor (2) and the grounding conductor (4) at the high-impedance section (7a) is lower than an effective dielectric constant between the signal conductor (2) and the grounding conductor (4) at the low-impedance section (7b).

[7] An antenna device comprising:
the phase-shifting circuit (1) according to any one of [1] to [6].

Although the embodiment of the present invention has been described above, the embodiment described above should not be construed as limiting the invention in the appended claims. It should also be noted that not all the combinations of the features described in the above embodiment are essential to the means for solving the problems of the invention.

The present invention may be enforced with appropriate modification without going beyond the gist of the invention.

For example, in the above embodiment, the case of application for a triplate structure transmission line is explained, however, the configuration of the transmission line is not limited thereto, e.g. the present invention is also applicable to the strip line.

EXPLANATION OF REFERENCE NUMERALS

1 . . . Phase-shifting circuit
2 . . . Signal conductor
3 . . . Dielectric body
4 . . . Grounding conductor
5 . . . Overlapping section
6 . . . Non-overlapping section
7 . . . Transformer unit
7a . . . High-impedance section
7b . . . Low-impedance section
8 . . . Through-hole
9 . . . Dielectric layer

What is claimed is:
1. A phase-shifting circuit, comprising:
a signal conductor for transmitting a signal; and
a dielectric body disposed to overlap with the signal conductor, to change a phase of the signal by changing an area of an overlapping section in which the signal conductor overlaps with the dielectric body by moving the dielectric body,
the phase-shifting circuit further comprising:
a transformer unit provided on an input side end and an output side end for the signal of the dielectric body, for impedance matching between the overlapping section and a non-overlapping section, in which the signal conductor does not overlap with the dielectric body, the transformer unit comprising a high-impedance section provided on an overlapping section side and a low-impedance section provided on a non-overlapping section side, a characteristic impedance of the low-impedance section being lower than a characteristic impedance of the high-impedance section.

2. The phase-shifting circuit, according to claim 1, wherein the high-impedance section comprises an air layer and the low-impedance section comprises a dielectric layer having a same thickness as a thickness of the dielectric body and comprising a same material as a material of the dielectric body.

3. The phase-shifting circuit, according to claim 2, wherein the transformer unit comprises a through-hole formed at a position spaced from an input side end and an output side end of the signal of the dielectric body, and the transformer unit is configured such that the through-hole is provided as the high-impedance section and the dielectric body between (1) the through-hole and (2) the input side end and the output side end of the signal is provided as the low-impedance section.

4. The phase-shifting circuit, according to claim 1, wherein a phase of the signal is changed by changing an area of the overlapping section by moving the dielectric body within a moving range which is preset, and the transformer unit is located on the input side end and the output side end of the signal of the dielectric body when the dielectric body is moved within the moving range.

5. The phase-shifting circuit, according to claim 1, wherein the transformer unit comprises a multistage configuration.

6. The phase-shifting circuit, according to claim 1, further comprising:
   a grounding conductor disposed on the dielectric body on an opposite side to a side of the signal conductor,
   wherein an effective dielectric constant between the signal conductor and the grounding conductor at the high-impedance section is lower than an effective dielectric constant between the signal conductor and the grounding conductor at the low-impedance section.

7. An antenna device comprising:
   the phase-shifting circuit according to claim 1.

* * * * *